(12) United States Patent
Ma

(10) Patent No.: US 10,540,923 B2
(45) Date of Patent: Jan. 21, 2020

(54) SHIFT REGISTER, METHOD FOR DRIVING SAME, GATE DRIVING CIRCUIT

(71) Applicant: BOE Technology Group Co., Ltd., Beijing (CN)

(72) Inventor: Zhanjie Ma, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 217 days.

(21) Appl. No.: 15/511,286

(22) PCT Filed: Apr. 26, 2016

(86) PCT No.: PCT/CN2016/080223
§ 371 (c)(1),
(2) Date: Mar. 15, 2017

(87) PCT Pub. No.: WO2016/188287
PCT Pub. Date: Dec. 1, 2016

(65) Prior Publication Data
US 2017/0287388 A1 Oct. 5, 2017

(30) Foreign Application Priority Data

May 28, 2015 (CN) .......................... 2015 1 0283508

(51) Int. Cl.
G11C 19/00 (2006.01)
G09G 3/20 (2006.01)
(Continued)

(52) U.S. Cl.
CPC ........... *G09G 3/2092* (2013.01); *G11C 19/28* (2013.01); *G09G 3/3677* (2013.01);
(Continued)

(58) Field of Classification Search
None
See application file for complete search history.

(56) References Cited

U.S. PATENT DOCUMENTS 8,289,261 B2 10/2012 Lee et al.
8,305,326 B2 11/2012 Kim et al.
(Continued)

FOREIGN PATENT DOCUMENTS

CN 1758321 A 4/2006
CN 101364392 A 2/2009
(Continued)

OTHER PUBLICATIONS

International Search Report (English translation) and Written Opinion of International Application No. PCT/CN2016/080223, dated Jul. 28, 2016, 7 pages.
(Continued)

*Primary Examiner* — Tuan T Lam
(74) *Attorney, Agent, or Firm* — Westman, Champlin & Koehler, P.A.

(57) ABSTRACT

The present disclosure relates to display technology, and more particularly, to a shift register, a method for driving the shift register, a gate driving circuit and a display apparatus. The shift register comprises a pull-up module, a pull-down module and a holding module. The pull-up module is connected to the holding module and the pull-down module, an electrical connection point of the pull-up module and the pull-down module constituting an output signal terminal, and configured to pull up a signal outputted at the output signal terminal in response to a first clock signal. The pull-down module is connected to the holding module and configured to pull down the signal outputted at the output signal terminal in response to a second clock signal. The holding module is configured to hold a signal outputted from the pull-up module and the pull-down module at a fixed level.

8 Claims, 2 Drawing Sheets

(51) Int. Cl.
*G11C 19/28* (2006.01)
*G09G 3/36* (2006.01)

(52) U.S. Cl.
CPC .............. *G09G 2310/0286* (2013.01); *G09G 2310/0291* (2013.01); *G09G 2310/08* (2013.01); *G09G 2320/0219* (2013.01)

(56) References Cited

U.S. PATENT DOCUMENTS

| | | | |
|---|---|---|---|
| 8,704,748 B2 | 4/2014 | Kim et al. | |
| 9,240,781 B2 | 1/2016 | Wu et al. | |
| 2007/0296662 A1 | 12/2007 | Lee et al. | |
| 2007/0296681 A1 | 12/2007 | Kim et al. | |
| 2011/0001732 A1 | 1/2011 | Morii et al. | |
| 2012/0133574 A1* | 5/2012 | Wu | G09G 3/20 345/55 |
| 2012/0294411 A1* | 11/2012 | Duan | G09G 3/3233 377/64 |
| 2012/0300894 A1* | 11/2012 | Wu | G11C 19/184 377/79 |
| 2015/0009113 A1 | 1/2015 | Zeng et al. | |
| 2015/0043704 A1* | 2/2015 | Ma | G09G 3/3677 377/68 |
| 2015/0155052 A1* | 6/2015 | Ma | G09G 3/36 345/100 |
| 2015/0302933 A1* | 10/2015 | Ma | G11C 19/28 345/215 |
| 2016/0133211 A1* | 5/2016 | Ma | G11C 19/28 345/205 |
| 2016/0217870 A1* | 7/2016 | Tseng | G11C 19/28 |
| 2016/0246418 A1 | 8/2016 | Wang et al. | |
| 2016/0253950 A1* | 9/2016 | Ma | G09G 3/36 345/100 |
| 2016/0293090 A1* | 10/2016 | Long | G09G 3/2092 |
| 2017/0004801 A1* | 1/2017 | Li | G11C 19/28 |
| 2017/0124936 A1* | 5/2017 | Tseng | G09G 3/2092 |
| 2017/0154602 A1* | 6/2017 | Sun | G09G 3/20 |
| 2017/0287393 A1* | 10/2017 | Ma | G11C 19/28 |
| 2017/0287413 A1* | 10/2017 | Li | G09G 3/3426 |
| 2018/0091151 A1* | 3/2018 | Zheng | G09G 3/3266 |

FOREIGN PATENT DOCUMENTS

| | | |
|---|---|---|
| CN | 101650506 A | 2/2010 |
| CN | 101939791 A | 1/2011 |
| CN | 103208263 A | 7/2013 |
| CN | 104217763 A | 12/2014 |
| CN | 104299595 A | 1/2015 |
| CN | 104537980 A | 4/2015 |
| CN | 104835442 A | 8/2015 |

OTHER PUBLICATIONS

English translation of Box No. V of the Written Opinion for the International Searching Authority for International Application No. PCT/CN2016/080223, 2 pages.

First Office Action, including Search Report, for Chinese Patent Application No. 201510283508.1, dated Jan. 11, 2017, 9 pages.

\* cited by examiner

US 10,540,923 B2

SHIFT REGISTER, METHOD FOR DRIVING SAME, GATE DRIVING CIRCUIT

CROSS-REFERENCE TO RELATED APPLICATION(S)

This application is a Section 371 National Stage application of International Application No. PCT/CN2016/080223, filed on Apr. 26, 2016, which published as WO 2016/188287 A1, on Dec. 1, 2016, and claims priority to the Chinese Patent Application No. 201510283508.1, filed on May 28, 2015, entitled "SHIFT REGISTER, METHOD FOR DRIVING SAME, GATE DRIVING CIRCUIT AND DISPLAY APPARATUS" which are incorporated herein by reference in their entirety.

TECHNICAL FIELD

The present disclosure relates to display technology, and more particularly, to a shift register, a method for driving the shift register, a gate driving circuit and a display apparatus.

BACKGROUND

In a shift register structure; there is an inevitable parasitic capacitance in a pull-down transistor in a pull-down structure connected to an output terminal. Due to a coupling effect of the parasitic capacitance of the pull-down transistor itself, a signal for controlling the gate of the transistor will be influenced by a clock signal associated with the output of the transistor. For example, a transition in the clock signal may lead to a change in the potential at the gate of the pull-down transistor, which will cause the output waveform of the shift register to fluctuate, such that the output signal, and in turn the output effect, from the shift register will be degraded.

SUMMARY

There is provided a shift register and a method for driving the shift register as well as a gate driving circuit and a display apparatus.

According to an embodiment, a shift register is provided. The shift register comprises: a pull-up module, a pull-down module and a holding module. The pull-up module is connected to the holding module and the pull-down module, an electrical connection point of the pull-up module and the pull-down module constituting an output signal terminal, and configured to pull up a signal outputted at the output signal terminal in response to a first clock signal. The pull-down module is connected to the holding module and configured to pull down the signal outputted at the output signal terminal in response to a second clock signal. The holding module is configured to hold a signal outputted from the pull-up module and the pull-down module at a fixed level.

According to an embodiment, the pull-down module comprises a first transistor, a second transistor and a first capacitor. The first transistor has its gate connected to the first clock signal, its first electrode connected to a turn-on voltage signal and its second electrode connected to a gate of the second transistor. The second transistor has its gate further connected to a first terminal of the first capacitor, its first electrode connected to a second terminal of the first capacitor and to the pull-up module for constituting the out signal terminal, and its second electrode connected to the second clock signal.

According to an embodiment, the pull-up module comprises a third transistor and a fourth transistor. The fourth transistor has its gate connected to the first clock signal, its first electrode connected to a low level signal and its second electrode connected to a gate of the third transistor. The third transistor has its first electrode connected to a high level signal and its second electrode connected to the first electrode of the second transistor to constitute the output signal terminal.

According to an embodiment, the holding module comprises a fifth transistor, a sixth transistor, a seventh transistor, an eighth transistor and a second capacitor. The sixth transistor has its gate receiving the first clock signal and connected to its first electrode, and its second electrode connected to a second electrode of the seventh transistor. The seventh transistor has its gate connected to the output signal terminal, its first electrode connected to the turn-on voltage signal and to a second terminal of the second capacitor, and its second electrode further connected to a first terminal of the second capacitor. The fifth transistor has its gate connected to the second clock signal, its first electrode connected to the gate of the third transistor and a gate of the eighth transistor, and its second electrode connected to the second electrode of the seventh transistor. The eighth transistor has its first electrode connected to the gate of the second transistor and its second electrode connected to the second terminal of the second capacitor.

According to an embodiment, the first to the eighth transistors are all N-type transistors. Alternatively, the first to the eighth transistors are all P-type transistors. Alternatively, some of the first to the eighth transistors are P-type transistors and the others are N-type transistors.

A gate driving circuit is provided. The gate driving circuit comprises the above shirt register.

A display apparatus is provided. The display apparatus comprises the above gate driving circuit.

A method for driving the above shift register is provided. The method comprises: initializing the holding module by the pull-up module and the pull-down module in an initialization period; pulling down the signal outputted at the output signal terminal in response to the second clock signal by the pull-down module in a pull-down output period; pulling up the signal outputted at the output signal terminal in response to the first clock signal by the pull-up module in a pull-up output period; and holding the signal outputted from the pull-up module and the pull-down module at the fixed level by the holding module in a potential fixing period.

According to an embodiment, the method further comprises: in the initialization period, enabling the first clock signal and the turn-on voltage signal to charge the first capacitor and the second capacitor, during this period the pull-down module outputting a signal at the output signal terminal and simultaneously the pull-up module outputting a signal at the output signal terminal, such that the signal outputted at the output signal terminal is enhanced; in the pull-down outputting period, enabling the second clock signal, such that the pull-down module pulls down the signal outputted at the output signal terminal in response to the second clock signal; in the pull-up outputting period, enabling the first clock signal, such that the pull-up module pulls up the signal outputted at the output signal terminal in response to the first clock signal, and holding the first terminal of the second capacitor at a potential of the first clock signal; in the potential fixing period, enabling the holding module to hold stability of the signal at the output signal terminal; and repeating the above actions in the pull-up outputting period and the potential fixing period.

According to an embodiment, the first clock signal and the second clock signal are pulse signals having the same voltage amplitude and inverse phases from each other. The turn-on voltage signal is a single pulse signal having a voltage amplitude equal to that of the first clock signal and synchronized with an initial pulse of the first clock signal.

DETAILED DESCRIPTION OF THE EMBODIMENTS

In the following, the shift register, the method for driving the shift register and the display apparatus will be described in further detail with reference to the figures and embodiments, such that the solutions of the present disclosure will become more apparent to those skilled in the art.

According to an embodiment, a shift register is provided. A number of shift registers can be cascaded to output a series of waveforms that vary from one stage to another, i.e., to output a number of gate driving signals.

Figure 1:
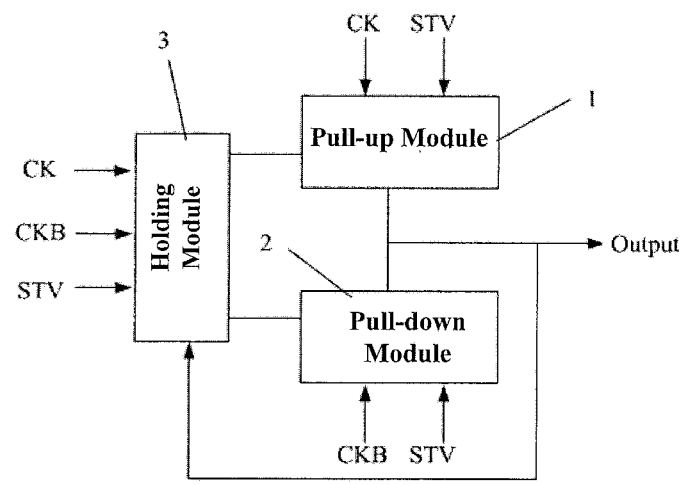
FIG. 1 is a schematic diagram showing structures of modules in a shift register according to a first embodiment of the present disclosure.

As shown in FIG. 1, the shift register includes a pull-up module 1, a pull-down module 2 and a holding module 3.

The pull-up module 1 is connected to the holding module 3 and the pull-down module 2, an electrical connection point of the pull-up module 1 and the pull-down module 2 constituting an output signal terminal, Output, and configured to pull up a signal (e.g., a gate driving signal) outputted at the output signal terminal Output in response to a first clock signal, CK.

The pull-down module 2 is connected to the holding module 3 and configured to pull down the signal outputted at the output signal terminal Output in response to a second clock signal, CKB.

The holding module 3 is configured to hold a signal outputted from the pull-up module 1 and the pull-down module 2 at a fixed level.

Figure 2:
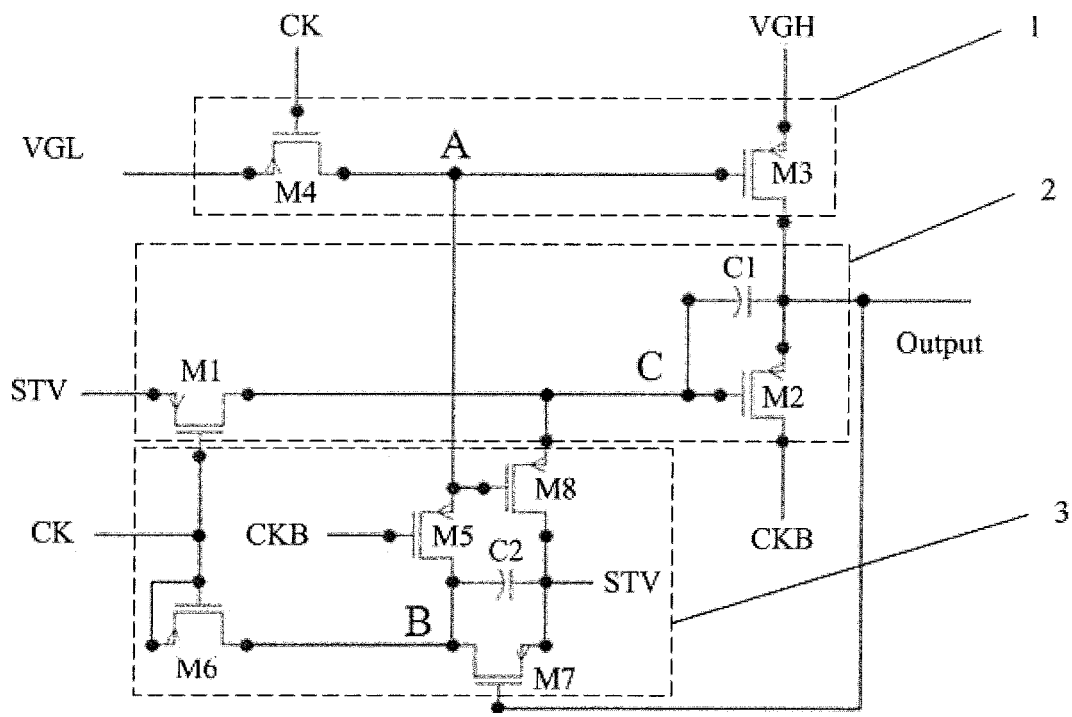
FIG. 2 shows a circuit diagram of the shift register shown in FIG. 1.

As shown in FIG. 2, the shift register in this embodiment has an 8T2C structure, i.e., including 8 transistors and 2 capacitors.

In particular, the pull-down module 2 includes a first transistor, M1, a second transistor, M2, and a first capacitor, C1.

The first transistor M1 has its gate connected to the first clock signal CK, its first electrode connected to a turn-on voltage signal, STV, and its second electrode connected to a gate of the second transistor M2.

The second transistor M2 has its gate further connected to a first terminal of the first capacitor C1, its first electrode connected to a second terminal of the first capacitor C1 and to the pull-up module 1 for constituting the out signal terminal Output, and its second electrode connected to the second clock signal CKB.

The pull-up module 1 includes a third transistor, M3, and a fourth transistor, M4.

The fourth transistor M4 has its gate connected to the first clock signal CK, its first electrode connected to a low level signal, VGL, and its second electrode connected to a gate of the third transistor M3.

The third transistor M3 has its first electrode connected to a high level signal, VGH, and its second electrode connected to the first electrode of the second transistor M2 to constitute the output signal terminal Output.

The holding module 3 includes a fifth transistor, M5, a sixth transistor, M6, a seventh transistor, M7, an eighth transistor, M8, and a second capacitor, C2.

The sixth transistor M6 has its gate receiving the first clock signal CK and connected to its first electrode, and its second electrode connected to a second electrode of the seventh transistor M7.

The seventh transistor M7 has its gate connected to the output signal terminal Output, its first electrode connected to the turn-on voltage signal STV and to a second terminal of the second capacitor C2, and its second electrode further connected to a first terminal of the second capacitor C2.

The fifth transistor M5 has its gate connected to the second clock signal CKB, its first electrode connected to the gate of the third transistor M3 and a gate of the eighth transistor M8, and its second electrode connected to the second electrode of the seventh transistor M7.

The eighth transistor M8 has its first electrode connected to the gate of the second transistor M2 and its second electrode connected to the second terminal of the second capacitor C2.

The second terminal of the second capacitor C2 is further connected to the turn-on voltage signal STV.

It can be appreciated that the first to the eighth transistors M1-M8 can all be N-type transistors. Alternatively, the first to the eighth transistors M1-M8 can all be P-type transistors. The shift register according to the embodiment has been described assuming that they are PMOS thin film transistors. Alternatively, some of the first to the eighth transistors M1-M8 can be P-type transistors and the others can be N-type transistors, as long as the respective terminals of the transistors are connected correctly.

In the structure of the shift register according to the embodiment, the potential node (i.e., at C in FIG. 2) at the gate of the pull-down transistor (i.e., the second transistor M2 in FIG. 2) will not be influenced by the clock signals associated with the output of the transistor, such that the stability of the potential node for controlling the gate of the pull-down transistor can be improved, the output stability of the shift register can be increased and the output effect of the shift register can be enhanced.

According to an embodiment, a method for driving the shift register according to the above first embodiment is provided. The method includes: an initialization period in which the pull-up module and the pull-down module initializes the holding module; a pull-down output period in which the pull-down module pulls down the signal (e.g., a gate driving signal) outputted at the output signal terminal in response to the second clock signal CKB; a pull-up output period in which the pull-up module pulls up the signal outputted at the output signal terminal in response to the first clock signal CK; and a potential fixing period in which the holding module holds the signal outputted from the pull-up module and the pull-down module at the fixed level.

Here, the signal outputted at the output signal terminal is a pulse signal which is at a first level during the pull-down outputting period and a different, second level during other periods. For example, the first level can be a low level and the second level can be a high level. Of course, the present disclosure is not limited to this. Rather, by controlling the respective signaling, the first level can be a high level and the second level can be a low level.

According to an embodiment, the method further includes the following.

In the initialization period, the first clock signal CK and the turn-on voltage signal STV are enabled to charge the first capacitor C1 and the second capacitor C2. During this period the pull-down module outputs a signal at the output signal terminal Output and simultaneously the pull-up module outputs a signal at the output signal terminal Output, such that the signal outputted at the output signal terminal Output is enhanced. In this way, the stability of the shift register can be improved.

In the pull-down outputting period, the second clock signal CKB is enabled, such that the pull-down module pulls down a voltage of the signal outputted at the output signal terminal in response to the second clock signal CKB. During this period, the signal outputted at the output signal terminal Output transitions.

In the pull-up outputting period, the first clock signal CK is enabled, such that the pull-up module pulls up a voltage of the signal outputted at the output signal terminal in response to the first clock signal CK. Meanwhile, the first terminal of the second capacitor C2 is held at a potential of the first clock signal CK.

In the potential fixing period, the second clock signal CKB is enabled and the holding module is enabled to hold stability of the signal at the output signal terminal Output.

The above actions in the pull-up outputting period and the potential fixing period can be repeated, such that the shift register can continuously output the gate driving signal, until the next time the turn-on voltage signal STV is enabled.

According to an embodiment, the first clock signal CK and the second clock signal CKB are pulse signals having the same voltage amplitude and inverse phases from each other.

For example, the first clock signal CK and the second clock signal CKB are pulse signals having the same voltage amplitude and a phase difference of a half of a clock cycle from each other.

The turn-on voltage signal STV is a single pulse signal having a voltage amplitude equal to that of the first clock signal CK and synchronized with an initial pulse of the first clock signal CK.

Figure 3:
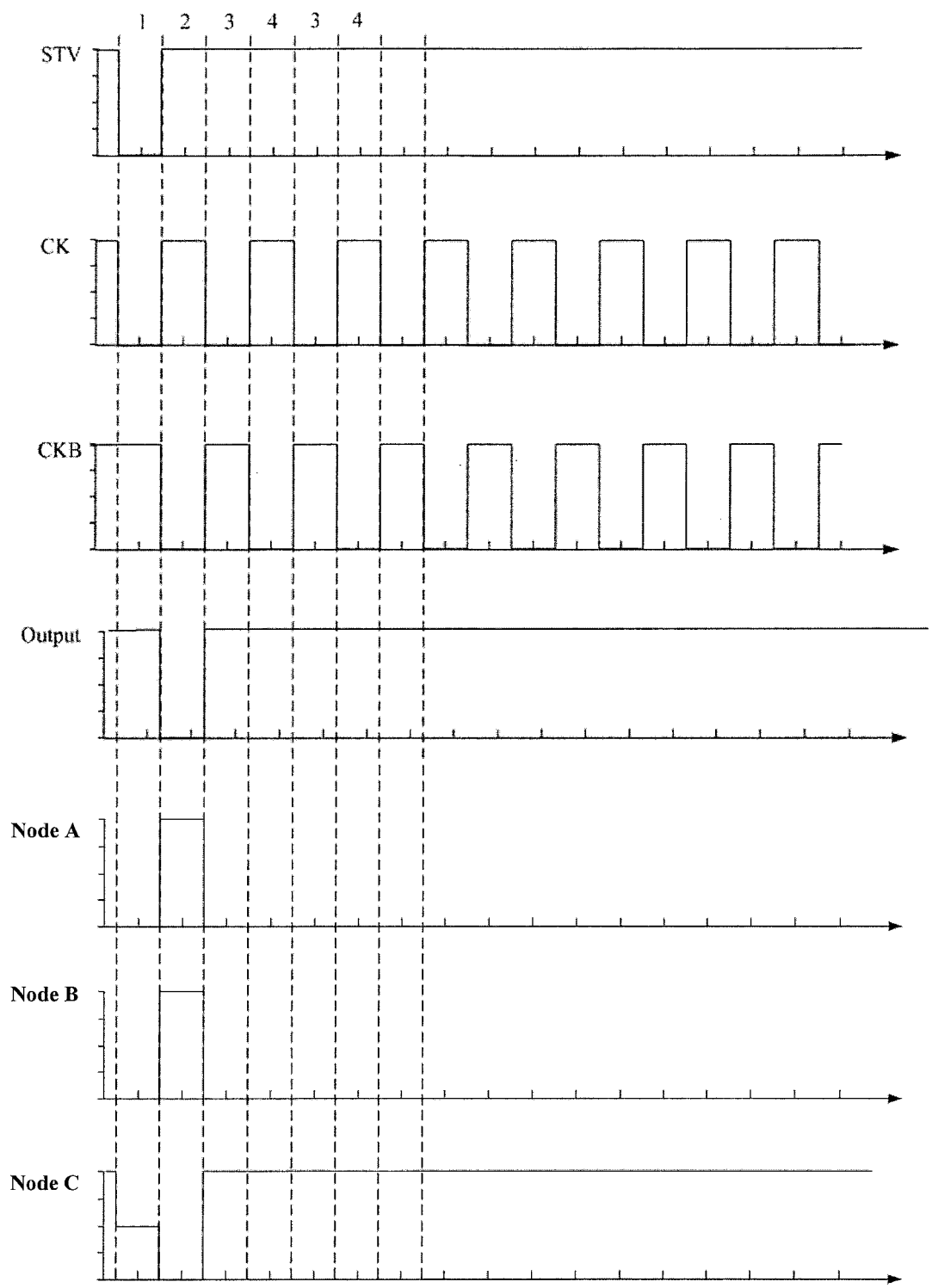
FIG. 3 shows a timing sequence diagram of the shift register shown in FIG. 2.

Next, the operation principles of the shift register will be introduced in detail with reference to FIG. 3.

First Period (i.e., the Initialization Period):

The turn-on voltage signal STV (referred to as STV signal hereinafter) and the first clock signal (referred to as CK signal hereinafter) are both low-level on signals, and the second clock signal (referred to as CKB signal hereinafter) is a high-level off signal.

When the STV signal and the CK signal are at the low level, the first transistor M1, the sixth transistor M6 and the fourth transistor M4 are turned on.

When the first transistor M1 is turned on, the low-level STV signal is inputted, via the first transistor M1, to the gate of the second transistor M2 and charges the first capacitor C1. At this time, the second transistor M2 is turned on as the low-level STV signal is written to its gate, such that the high-level CKB signal is written to the output signal terminal Output of the shift register.

When the fourth transistor M4 is turned on, a low-level signal VGL (referred to as VGL signal hereinafter) is written to the gate of the third transistor M3 to turn on the third transistor M3, such that a high-level signal VGH (referred to as VGH signal hereinafter) is written to the output signal terminal Output of the shift register. In this way, the signal outputted from the shift register can be enhanced. That is, the second transistor M2 and the third transistor M3 both output high-level signals to the output signal terminal Output of the shift register. When compared with one single transistor, its output capability is enhanced and its stability is improved.

Meanwhile, as the sixth transistor M6 is also on, the low-level CK signal is written to one electrode terminal of the second capacitor C2 (i.e., a first terminal, corresponding to point B in FIG. 2), to charge the second capacitor C2.

Second Period (i.e., the Pull-Down Outputting Period):

The CKB signal is a low-level on signal, whereas the STV signal and the CK signal are both high-level off signals.

When the CKB signal is at the low level, the STV signal written to the first capacitor C1 during the first period (i.e., the initialization period) holds the second transistor M2 on, such that the low-level CKB signal is written to the output signal terminal Output. In this way, the seventh transistor M7 controlled by the output signal terminal Output is turned on, such that the high-level STV signal is written to one terminal of the second capacitor C2 (i.e., a first terminal, corresponding to point B in FIG. 2).

Meanwhile, the fifth transistor M5 controlled by the low-level CKB signal is turned on, such that the high-level STV signal is written to the gate of the third transistor M3 and the gate of the eighth transistor M8, via the seventh transistor M7 and the fifth transistor M5 respectively, such that the third transistor M3 and the eighth transistor M8 are turned off, thereby avoiding influences on the signal outputted at the output signal terminal Output of the shift register and the potential at the gate of the second transistor M2 and holding stability of the signal outputted at the output signal terminal Output.

Third Period (i.e., Pull-Up Outputting Period)

The CK signal is a low-level on signal, and the STV signal and the CKB signal are both high-level off signals.

When the CK signal is at the low level, the first transistor M1, the sixth transistor M6 and the fourth transistor M4 are turned on.

When the first transistor M1 is turned on, the high-level STV signal is written to the gate of the second transistor M2 and charges the first capacitor C1. In this case, the second transistor M2 is off.

When the fourth transistor M4 is turned on, the VGL signal is written to the gate of the third transistor M3 to turn on the third transistor M3 again, such that the VGH signal is written to the output signal terminal Output of the shift register via the third transistor M3. In this case, the seventh transistor M7 controlled by the output signal terminal Output is turned off.

When the sixth transistor M6 is turned on, the low-level CK signal is written to the first terminal of the second capacitor C2 and held by the second capacitor C2. In other words, the potential at the first terminal of the second capacitor C2 is held at the potential of the CK signal.

Fourth Period (i.e., Potential Fixing Period):

The CKB signal is a low-level on signal, and the STV signal and the CK signal are high-level off signals.

When the CKB signal is at the low level, the fifth transistor M5 it controls is turned on. Thus, the low-level CK signal stored on the second capacitor C2 is inputted to the gate of the third transistor M3 and the gate of the eighth transistor M8, such that the third transistor M3 and the eighth transistor M8 are turned on. When the third transistor M3 is on, the VGH signal is continuously written to the output signal terminal Output of the shift register. When the eighth transistor M8 is turned on, the high-level STV signal is written to the gate of the second transistor M2, to ensure that the second transistor M2 is off and to hold stability of the signal at the output signal terminal Output of the shift register.

The actions in the third and fourth periods will be repeated in subsequent operation processes. That is, the actions in the pull-up outputting period and the potential fixing period are repeated, such that the shift register can continuously output the gate driving signal, until the next time the turn-on voltage signal STV becomes low.

In order to show voltage changes at the respective nodes in FIG. 2 in response to different clock signals in a more intuitive manner, FIG. 3 shows waveforms of the output signal terminal Output, the turn-on voltage signal STV, the first clock signal CK and the second clock signal CKB, as well as waveforms outputted at the respective main nodes of the shift register (including Nodes A, B and C, where Node A corresponds to the gate of the third transistor M3, Node C corresponds to the gate of the second transistor M2 and is associated with the first capacitor C1, and Node B corresponds to the electrical connection point of the second electrode of the fifth transistor M5 and the second electrode of the seventh transistor M7 and is associated with the second capacitor C2). It can be seen from the waveforms at the respective nodes as shown in FIG. 3, the waveforms outputted at the respective nodes are stable and the clock signals' influence on the output signal terminal Output of the shift register is minimized, such that the stability of the signal outputted at the output signal terminal Output of the shift register can be improved, thereby ensuring normal outputting from the shift register and high stability of the outputted gate driving signal.

During operation of the shift register in the embodiment, after a low pulse has been outputted, the second transistor M2 shall be always off. In this case, a stable high potential is required at Node C to turn off the second transistor M2. In the conventional shift register, since the second clock signal CKB will cause changes at Node C due to gate-source coupling capacitance of the second transistor M2 itself. When the second clock signal CKB switches from the high level to the low level, the potential at Node C will be pulled down, such that the off state of the second transistor M2 will be degraded. In the shift register of the embodiment, the voltage at Node C is fixed and thus does not vary as the second clock signal CKB varies, so as to avoid degradation of the off state of the pull-down transistor due to its own coupling capacitance. Accordingly, the output stability of the shift register can be increased and the output effect of the shift register can be enhanced.

To summarize, with the above shift register and the corresponding method for driving the shift register, the embodiment ensures that, in each period, the gate of the second transistor M2 and the gate of the third transistor M3, which have influences on the output characteristics, always have stable inputted signals, such that the shift register can have a stable output signal and thus a more stable performance.

It can be appreciated that the shift register in the first embodiment and the method for driving the shift register in the second embodiment are applicable to the field of display incorporating shift registers.

According to an embodiment, a gate driving circuit is provided. The gate driving circuit includes the shift register of the first embodiment.

A number of shift registers as described above in the first embodiment can be cascaded for form a gate driving circuit capable of outputting a series of waveforms that vary from one stage to another, allowing a stage-by-stage transfer of signals. In particular, an output signal terminal Output of a shift register at a certain stage is connected to a reset terminal of a shift register at the previous stage and to an input terminal of the shift register at the next stage.

The gate driving circuit, incorporating the above shift register, can have a stable performance.

According to an embodiment, a display apparatus is provided. The display apparatus includes the gate driving circuit of the third embodiment, which can be driven with reference to the method for driving the shift register according to the second embodiment.

The display apparatus can include a liquid crystal panel, an e-paper, an OLED panel, a mobile phone, a tablet computer, a television, a display, a notebook computer, a digital frame, a navigator, or any product or component having a display function.

The display apparatus, incorporating the above gate driving circuit, has a stable performance and a better display effect.

It can be appreciated that the above embodiments are exemplary only, for illustrating the principles of the present disclosure. However, the present disclosure is not limited to those embodiments. A number of variants and modifications can be made by those skilled in the art without departing from the spirit and scope of the present disclosure. These variants and modifications are to be encompassed by the scope of the present disclosure.

What is claimed is:

1. A shift register, comprising:
   a pull-up module;
   a pull-down module; and
   a holding module,
   wherein,
   the pull-up module is connected to the holding module and the pull-down module, an electrical connection point of the pull-up module and the pull-down module constituting an output signal terminal, and configured to pull up a signal outputted at the output signal terminal in response to a first clock signal;
   the pull-down module is connected to the holding module and configured to pull down the signal outputted at the output signal terminal in response to a second clock signal; and
   the holding module is configured to hold a signal outputted from the pull-up module and the pull-down module at a fixed level;
   the pull-down module comprises a first transistor, a second transistor and a first capacitor,
   wherein:
   the first transistor has its gate connected to the first clock signal, its first electrode connected to a turn-on voltage signal and its second electrode connected to a gate of the second transistor,
   the second transistor has its gate further connected to a first terminal of the first capacitor, its first electrode connected to a second terminal of the first capacitor and to the pull-up module for constituting the out signal terminal, and its second electrode connected to the second clock signal;
   the pull-up module comprises a third transistor and a fourth transistor, wherein:

the fourth transistor has its gate connected to the first clock signal, its first electrode connected to a low level signal and its second electrode connected to a gate of the third transistor, and the third transistor has its first electrode connected to a high level signal and its second electrode connected to the first electrode of the second transistor to constitute the output signal terminal;

wherein the holding module comprises a fifth transistor and a sixth transistor, the fifth transistor has its gate connected to the second clock signal, its first electrode connected to the gate of the third transistor, and its second electrode connected to a second electrode of the sixth transistor, and the sixth transistor has its gate receiving the first clock signal and connected to its first electrode.

2. The shift register of claim 1, wherein the holding module further comprises a seventh transistor, an eighth transistor and a second capacitor, wherein:

the seventh transistor has its gate connected to the output signal terminal, its first electrode connected to the turn-on voltage signal and to a second terminal of the second capacitor, and its second electrode further connected to a first terminal of the second capacitor, and the eighth transistor has its first electrode connected to the gate of the second transistor and its second electrode connected to the second terminal of the second capacitor.

3. The shift register of claim 2, wherein:

the first to the eighth transistors are all N-type transistors, the first to the eighth transistors are all P-type transistors, or some of the first to the eighth transistors are P-type transistors and the others are N-type transistors.

4. A gate driving circuit, comprising the shirt register according to claim 1.

5. A method for driving the shift register according to claim 1, comprising:

Initializing the holding module by the pull-up module and the pull-down module in an initialization period;

pulling down the signal outputted at the output signal terminal by the pull-down module in response to the second clock signal in a pull-down output period;

pulling up the signal outputted at the output signal terminal by the pull-up module in response to the first clock signal in a pull-up output period; and holding the signal outputted from the pull-up module and the pull-down module at the fixed level by the holding module in a potential fixing period.

6. The method of claim 5, further comprising:

in the initialization period, enabling the first clock signal and the turn-on voltage signal to charge the first capacitor and a second capacitor, during this period the pull-down module outputting a signal at the output signal terminal and simultaneously the pull-up module outputting a signal at the output signal terminal;

in the pull-down outputting period, enabling the second clock signal, such that the pull-down module pulls down the signal outputted at the output signal terminal in response to the second clock signal;

in the pull-up outputting period, enabling the first clock signal, such that the pull-up module pulls up the signal outputted at the output signal terminal in response to the first clock signal, and holding the first terminal of the second capacitor at a potential of the first clock signal;

in the potential fixing period, enabling the holding module to hold stability of the signal at the output signal terminal; and repeating the above actions in the pull-up outputting period and the potential fixing period.

7. The method of claim 6, wherein the first clock signal and the second clock signal are pulse signals having the same voltage amplitude and inverse phases from each other, and the turn-on voltage signal is a single pulse signal having a voltage amplitude equal to that of the first clock signal and synchronized with an initial pulse of the first clock signal.

8. The method of claim 6, wherein the first clock signal and the second clock signal are pulse signals having the same voltage amplitude and a phase difference of a half of a clock cycle from each other, and the on voltage signal is a single pulse signal having a voltage amplitude equal to that of the first clock signal and synchronized with an initial pulse of the first clock signal.

* * * * *